United States Patent [19]

Patel

[11] Patent Number: 4,887,690

[45] Date of Patent: Dec. 19, 1989

[54] SPEAKER GRILLE ASSEMBLY

[75] Inventor: Bakulesh B. Patel, Coral Springs, Fla.

[73] Assignee: Motorola, Inc., Schaumburg, Ill.

[21] Appl. No.: 278,893

[22] Filed: Dec. 2, 1988

[51] Int. Cl.⁴ ........................ H05K 5/00

[52] U.S. Cl. ........................ 181/150; 181/175

[58] Field of Search ............... 181/148, 150, 175, 199; 381/158

[56] References Cited

U.S. PATENT DOCUMENTS

| | | | |
|---|---|---|---|
| 3,909,530 | 9/1975 | Gosswiller | 181/175 X |
| 3,938,618 | 2/1976 | Ambruoso, Sr. | 181/155 |
| 3,989,909 | 11/1976 | Hodsdon et al. | 181/175 X |
| 4,196,791 | 4/1980 | Gottlieb | 181/155 |

FOREIGN PATENT DOCUMENTS

| | | | |
|---|---|---|---|
| 445244 | 4/1936 | United Kingdom | 181/155 |

*Primary Examiner*—B. R. Fuller

*Attorney, Agent, or Firm*—Robert S. Babayi; Daniel K. Nichols

[57] ABSTRACT

A speaker grille assembly (800) includes a speaker grille 410), a felt (200), and a speaker (300). The speaker grille has a front surface (420), and a rear surface (430). The speaker grille (410) has plurality of equally spaced channels (440) for passage of sound. The sound channels (440) are formed such that that the rear surface port (422) is substantially larger than front surface port (411) thereby enhancing acoustic power transfer by increasing the effective sound passage space.

The sound channels (440) can be formed such that the passage through the grille (410) are provided with either gradual or sudden transition from front port (411) to the rear port (422) resulting in a larger rear surface apertures.

5 Claims, 4 Drawing Sheets

-PRIOR ART-

-PRIOR ART-

-PRIOR ART-

SPEAKER GRILLE ASSEMBLY

BACKGROUND OF THE INVENTION

Small communication units such as pagers and portable radios utilize a sound transducer or speaker for converting electrical signals to sound. Sound transfer efficiency in these applications is a critical parameter since it affects the loudness or acoustic power delivered by the device to outside world.

FIGS. 1, 2 and 3 illustrate a typical sound transfer mechanism. A speaker grille assembly 700 includes, a speaker grille 510 having plurality of openings 540 in shape of circular holes or slots for the passage of sound. A porous felt pad 200, having uniform porosity (open area), is positioned behind the grille 510 for preventing entry of foreign material into the unit. The speaker griller 510 is usually a part of a member 500 which may be a part of a housing assembly. A loudspeaker 300 is normally positioned behind the felt 200 and is fastened to the member 500.

Since the passages 540 are straight through holes, the rear surface ports 522 are equal to the front surface ports 511. The felt sheet 200 is usually positioned directly against the rear surface 520 thereby covering the rear openings 522 on the grille 510.

The disadvantage of the known art is that felt sheet 200 limits the open areas of ports 522 by its porosity ratio (open area) and reduces effective sound passage path thereby impeding acoustic power transfer. This configuration of the grille 510 and the felt sheet 200 assembly causes acoustic transmission losses in the range of 1.5 to 2.0 dB SPL (dB sound pressure level).

SUMMARY OF THE INVENTION

It is an object of this invention to provide an improved speaker grille assembly with more efficient sound transfer characteristics.

It is another object of the invention to increase the effective sound passage space of the speaker grille assembly.

Briefly, the invention incorporates a speaker grille, a felt, and a speaker into a speaker grille assembly. The speaker grille has a front surface, and a rear surface with each surface having a plurality of ports. These ports are interconnected to form a channel for passage of sound. The rear surface ports have been recessed to create substantially greater area than front surface ports thereby increasing the effective sound passage space. The felt is placed between the speaker and the rear surface of the speaker grille, covering the ports. Acoustic power transfer path has been enhanced due to increase in sound passage space.

In another aspect of the invention, the speaker grille sound channels can be formed such that the passages through the grille are provided with either gradual or sudden transition from front port to the rear port resulting in a larger rear surface area.

DESCRIPTION OF THE PREFERRED EMBODIMENT

FIGS. 4, 5, 6 and 7 illustrate a speaker grille assembly 800, in accordance with the present invention. This grille 410 is part of member 400 which may be a part of the housing for a radio device. The member 400 may be made of plastic or metallic material and may extend below the grille to form the front wall of a vertically elongated housing such as for a portable two-way radio.

Figure 1:
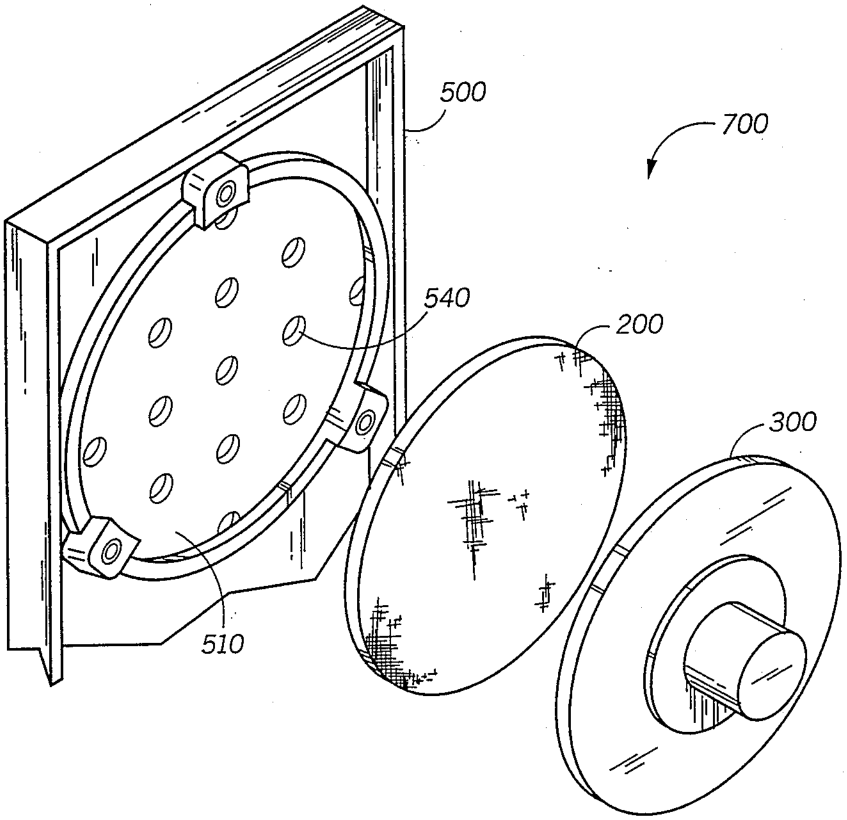
FIG. 1 is a exploded view of a prior art speaker grille and housing assembly.
Figure 2:
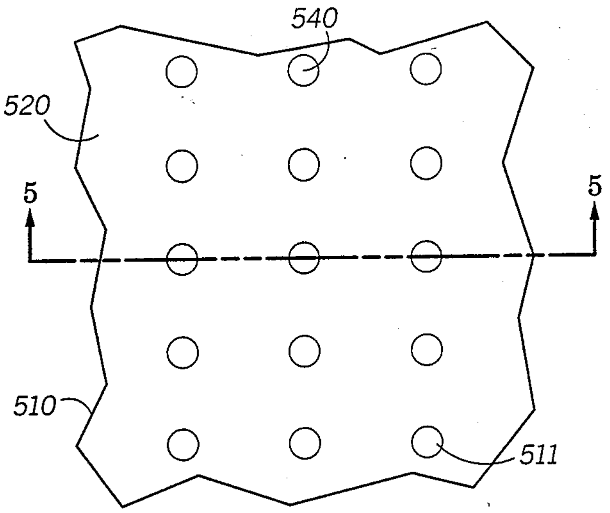
FIG. 2 is a fragmentary plan view of the speaker grille of FIG. 1.
Figure 3:
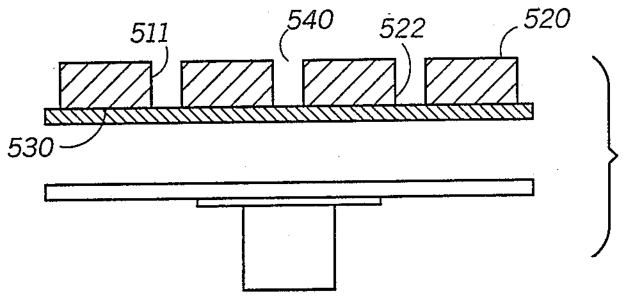
FIG. 3 is a cross sectional view taken along line 5—5 of FIG. 2.
Figure 4:
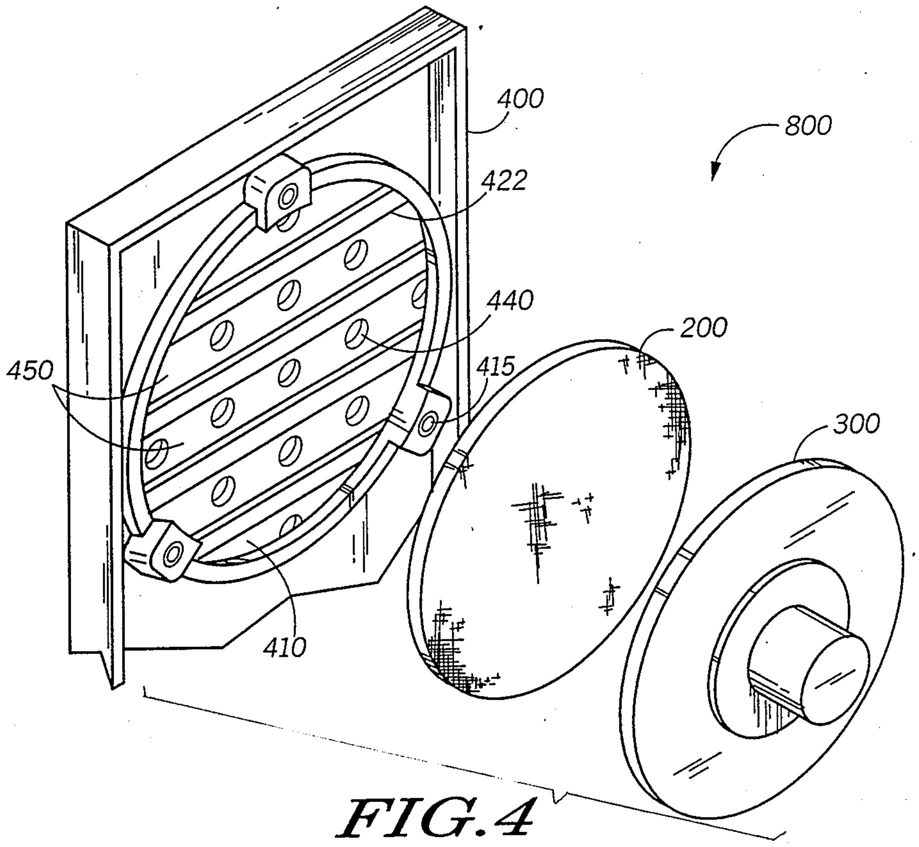
FIG. 4 is a exploded view of a preferred speaker grille housing assembly.
Figure 5:
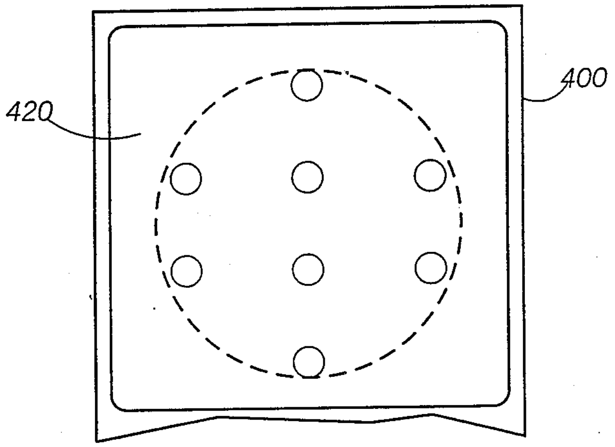
FIG. 5 a front elevational view of the speaker grille of FIG. 4.

FIGS. 4 and 5 show the grille 410 haing a front surface 420, a rear surface 430, and uniformly distanced open channels 440 for passage of sound. A felt pad or sheet 200 having a uniform porosity ratio (i.e., ratio of open area to closed area) is positioned between the speaker grille 410 and the speaker 300 to prevent foreign material from entering the unit. The speaker 300 has a peripheral margin 310 which engages the felt and is fastened to the member 400 by means of threaded inserts 115, screws (not shown), and brackets (not shown) in a conventional manner.

Figure 6:
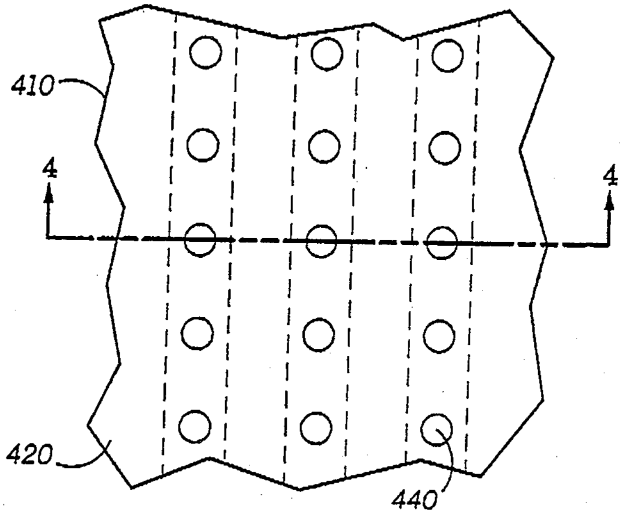
FIG. 6 is a fragmentary plan view of the speaker grille of FIG. 4.
Figure 7:
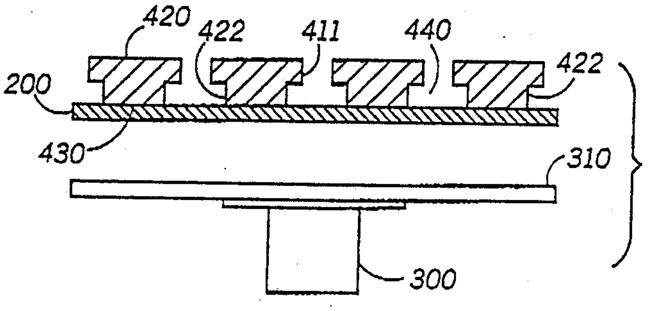
FIG. 7 is a cross sectional view taken along line 4—4 of FIG. 6.

FIG. 4 shows that the rear surface 430 includes grooves 450 extending in parallel across the speaker grille 410, and embodying rows of sound channels 440. FIG. 6 shows a portion of the preferred speaker grille 410, in which the non-uniform passages 440 are formed by interconnecting the front ports 411 to substantially larger rear ports 422. As shown in FIG. 7, The area around the rear port 422 is recessed providing a substantially greater opening than that of the front port 411.

The felt 200 is positioned adjacent the rear surface 430 covering substantially wider area of rear port 422, thereby allowing more efficient transfer of acoustic power due to increase in effective sound transfer path space. In practice an improvement of up to 2 dB SPL(dB sound pressure level) over prior art is achieved.

The sound channels 440 can be formed such that the passage through the grille 400 are provided with either gradual or sudden transition from front port 411 to the rear port 422 resulting in a larger rear surface apertures. The sound passages 440 can be in the form of slots or holes of other geometric shapes or combination of them. Furthermore the recessed grooves 450 of rear surface 430 can also include rows, columns or other arrangements of sound channels.

I claim as my invention:

1. A speaker grille assembly comprising in combination:
   - a grille having a front surface and a rear surface with plurality of channels therethrough for passage of sound, said channels providing interconnected front and rear ports, said rear surface including at least one recessed area about said rear port, said recessed area being substantially greater than the area of said front ports,
   - a speaker positioned to the rear of the grille, and
   - a sheet of porous material positioned between said rear surface and the speaker, the recessed area effectively increasing the sound passage of said grille assembly.

2. A speaker grille assembly as defined in claim 1, wherein said grille is a part of a housing assembly.

3. A speaker grille assembly of claim 1, wherein said porous sheet is a felt sheet.

4. A speaker grille assembly as defined in claim 1, wherein said front ports are uniformly spaced holes.

5. A speaker grille assembly comprising in combination:

a grille having a front surface and a rear surface with plurality of equally spaced channels therethrough for passage of sound, said channels providing interconnected front and rear ports, said rear surface including at least one recessed area about said rear port, said recessed area being substantially greater than the area of said front ports, a speaker positioned to the rear of the grille, and a porous felt sheet positioned between said rear surface and the speaker, the recessed area effectively increasing the sound passage of said grille assembly.

* * * * *